United States Patent [19]

Umeda

[11] Patent Number: 5,398,160
[45] Date of Patent: Mar. 14, 1995

[54] COMPACT POWER MODULE WITH A HEAT SPREADER

[75] Inventor: Osamu Umeda, Kawasaki, Japan

[73] Assignee: Fujitsu General Limited, Kawasaki, Japan

[21] Appl. No.: 136,881

[22] Filed: Oct. 18, 1993

[30] Foreign Application Priority Data

| Oct. 20, 1992 | [JP] | Japan | 4-0730067 U |
| Oct. 20, 1992 | [JP] | Japan | 4-0730068 U |
| Oct. 20, 1992 | [JP] | Japan | 4-0730069 U |

[51] Int. Cl.⁶ .................................. H05K 7/20
[52] U.S. Cl. ..................... 361/707; 257/711; 257/713; 361/719; 361/761
[58] Field of Search ............... 363/141; 174/52.2, 252, 174/16.3; 165/80.3, 185; 257/706, 707, 711, 713, 714, 717, 719–721; 361/704–713, 715, 717–719, 721, 722, 736, 752, 760, 761, 764, 776

[56] References Cited

U.S. PATENT DOCUMENTS

| 4,521,476 | 6/1985 | Asai | 428/209 |
| 4,924,351 | 5/1990 | Kato | 361/386 |
| 5,095,404 | 3/1992 | Chao | 361/385 |
| 5,198,964 | 3/1993 | Ito | 361/386 |
| 5,245,510 | 9/1993 | Honda | 361/718 |
| 5,272,375 | 12/1993 | Belopolsky | 257/717 |
| 5,287,247 | 2/1994 | Smits | 361/761 |

*Primary Examiner*—Gerald P. Tolin
*Attorney, Agent, or Firm*—Kanesaka & Takeuchi

[57] ABSTRACT

In a power module having at least one power device chip and circuits for driving and controlling the power device chip which are incorporated within one and the same package, a heat spreader which is constituted by a material having a heat dissipation property and supports the power device chip on its upper surface is inserted into an opening formed in a control substrate having an upper surface on which patterns for forming the chip driving and controlling circuits and a connection pattern for connection with the power device chip are printed, and the control substrate and the heat spreader inserted into the opening are fixedly supported on a base substrate. Thus, the power device chip and the control substrate can be disposed in plane and reduced in size.

6 Claims, 3 Drawing Sheets

COMPACT POWER MODULE WITH A HEAT SPREADER

BACKGROUND OF THE INVENTION

1. Field of the Invention

The present invention generally relates to power modules and particularly relates to a power module in which at least one power device chip and circuits for driving and controlling the power device chip are incorporated within one and the same package.

2. Description of the Related Art

A power module, which is small in size and excellent in workability, and in which at least one power device chip, for example, a power transistor chip, an MOS device chip, a diode chip, a thyristor chip, or the like; and circuits for driving and controlling the power device chip are incorporated within one and the same package has been used widely as an invertor power source circuit for composing a three-phase alternating current wave, or a power source circuit for controlling peripheral equipments.

Since the power device chip generates heat, therefore, there is a case where the heat causes the circuit elements of the built-in circuits for driving and controlling the power device chip to make erroneous operation or to get in failure. In order to protect the circuits for driving and controlling the power device chip from the heat of the power device chip, therefore, the circuits for driving and controlling the power device chip must be separated at a certain extent from the power device chip, and there is a limit in miniaturization of the power module.

There has been therefore proposed a power module having a two-layer inside structure to reduce the area occupied by the power module, as shown in FIGS. 4 and 5. That is, a power module 11 has a two-layer structure of a base substrate 13 and a control substrate 14. The base substrate 13 is constituted by an aluminum substrate or a DBC (direct bonding copper) substrate for supporting power device chips, for example, power transistor chips 12. On the other hand, the control substrate 14 is disposed at a distance above the base substrate 13 and constituted by a printed circuit substrate having printed patterns of circuits for driving and controlling the power transistor chips. An output terminal 15 of the power module is connected to the upper surface of the base substrate 13, and patterns are provided on the base substrate 13 for connection with input/output terminals of the power device chips 12 and the control circuit substrate 14. The control circuit substrate 14 is supported, at a distance above the base substrate 13, by connection terminals 16 which act also as support legs. The input/output terminals of the control circuit substrate 14 are connected to the base substrate 13 through the connection terminals 16. Circuit elements 17 of the circuits for driving and controlling the power transistor chips 12 are mounted on the control circuit substrate 14, and a control terminal 18 is also connected to the control circuit substrate 14. The base substrate 13 and the control circuit substrate 14 are covered with a case cover 19 of synthetic resin. The base substrate 13 is exposed at its lower surface. Alternatively, a heat sink plate may be attached onto the lower surface of the base substrate 13 if necessary.

Each transistor chip 12 employs a bare chip in which a base electrode 20 and an emitter electrode 21 are formed on its upper surface, while its lower surface is formed as a collector terminal 22 as a whole, as shown in FIG. 5. The lower surface, that is, the collector terminal 22, of this transistor chip 12 is fixed, through solder 24, onto the upper surface of a heat spreader 23 of metal such as copper having a high heat conductivity, and the lower surface of the heat spreader 23 is fixed onto the base substrate 13 through solder 25. The base and emitter electrodes 20 and 21 of the transistor chip 12 are connected to predetermined patterns 26 and 27 on the upper surface of the base substrate 13 by the wire bonding with aluminum wire 28. The collector terminal 22 is connected to a predetermined pattern (not shown) on the base substrate 13 through the solder 24 and wire bonding (not shown). The transistor chip 12 fixed on the base substrate 13 is coated with a sealing agent 29 of synthetic resin, as shown in FIG. 4.

Having such a two-layer structure, the power module can be reduced in its area, but it increases its height. Further, there is a defect that it is necessary to provide means for supporting the control circuit substrate 14 above the base substrate 13 and means for electrically connecting the base and control circuit substrates to each other. The structure is therefore made complicated, and the number of assembling steps increases. Further, the base substrate 13 is constituted by an aluminum substrate or a DBC substrate from the point of view of requiring high heat dissipation and insulation, resulting in increased material cost.

SUMMARY OF THE INVENTION

It is an object of the present invention to provide a power module which is simplified in the structure of connection between a base substrate supporting power device chips and a control substrate having printed patterns of circuits for driving and controlling the power deice chips.

It is another object of the present invention to provide a power module in which power device chips and circuits for driving and controlling the power device chips are arranged adjacently to each other substantially on one and the same plane.

In order to attain the above objects, according to the present invention, the power module in which at least one power device chip, circuits for driving and controlling the chip, and so on are incorporated within one and the same package comprises: a heat spreader which is constituted by a material having a heat dissipation property and which supports the power device chip on an upper surface thereof; a control substrate which has printed patterns formed on an upper surface thereof for forming the circuits for driving and controlling the chips, and a printed connection pattern formed on the upper surface thereof for connection with the power device chip, and which has an opening for inserting the heat spreader thereinto; and a base substrate which is constituted by a metal plate having a heat dissipation property and which fixedly supports the control substrate and fixedly supports the heat spreader inserted in the opening.

With this structure, the power device chip and the control substrate are supported substantially in one and the same plane so that it is possible to reduce the height to half in comparison with a conventional two-layer system. Further, since the heat spreader is fixed on the base substrate, the heat of the power device chip on the heat spreader is transmitted through the heat spreader to the base substrate so as to be dissipated from the base substrate, so that there is no fear that the heat is given to the circuit elements on the control substrate. It is therefore possible to dispose the circuit elements on the control substrate close to the power device chip to thereby make it possible to reduce the area of the control substrate, so that the power module can be reduced in size on a large scale in comparison with conventional ones.

Further, in the power module according to the present invention, preferably, the power device chip and the connection pattern of the control substrate are connected by wire bonding to make it possible to absorb the difference in thermal expansion coefficient between the heat spreader and the control substrate so that it is possible to improve the reliability against thermal stress. In this case, a part of the terminals of the power device chip may be soldered to the connection pattern of the control substrate so that the heat spreader and the control substrate can be firmly fixed to each other through solder to thereby make it possible to surely hold the heat spreader and the control substrate even if there occurs contraction due to the difference in thermal expansion coefficient between the heat spreader and the control substrate.

Other features and advantages of the present invention will be apparent from the following description of preferred embodiments.

DETAILED DESCRIPTION OF THE PREFERRED EMBODIMENTS

Figure 1:
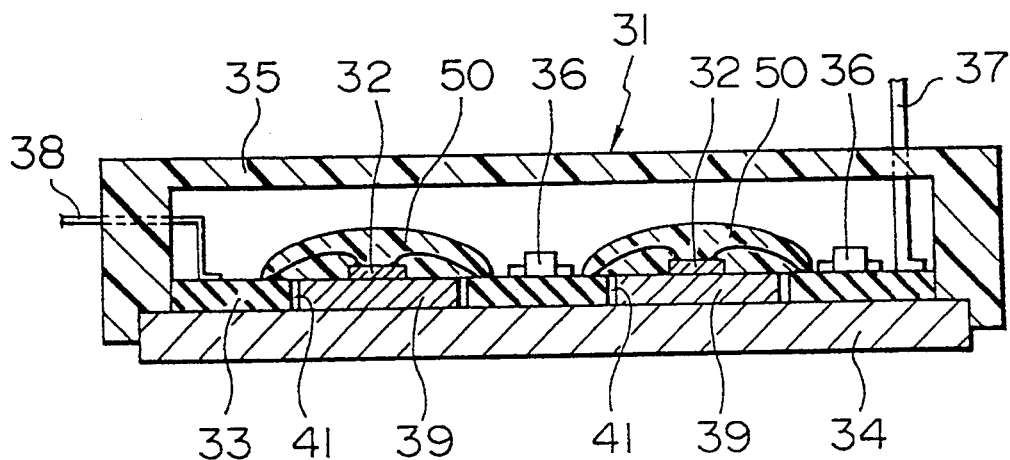
FIG. 1 is a vertical sectional view illustrating a main portion of a first embodiment of the power module according to the present invention.

Referring to the drawings, preferred embodiments of the present invention will be described under. In the embodiments, the constituent elements which are the same as or equivalent to each other are referenced correspondingly, and the description thereof is not repeated.

First, referring to FIGS. 1 and 2, a first embodiment will be described. A power module 31 is sealed by a base substrate 34 and a case cover 35 provided so as to cover the upper surface of the base substrate 34 with a predetermined space therebetween. The base substrate 34 supports thereon a sheet of control substrate 33 which is a printed circuit substrate on which patterns to be connected to the terminals of power device chips 32 and patterns of circuits for driving and controlling the chips are printed. Circuit elements 36 of the driving and controlling circuits are mounted on the control substrate 33 in the same manner as in the above-mentioned conventional example, and control and output terminals 37 and 38 of the power module 31 are connected to the control substrate 33. The base substrate 34 is constituted by a material such as an aluminum plate or the like having a property of good heat dissipation. A heat sink plate may be attached onto the back surface of the base substrate 34 in order to make the effect of heat dissipation higher.

Figure 2:
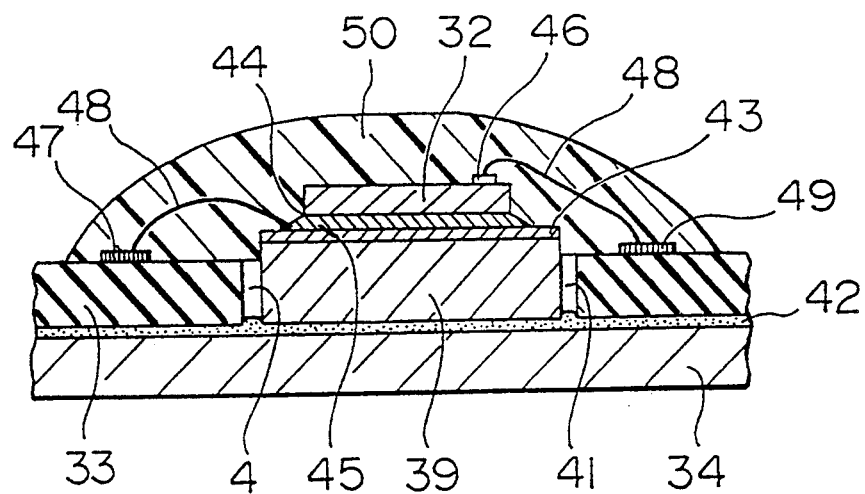
FIG. 2 is an enlarged vertical sectional view illustrating a power device chip portion in the first embodiment viewed in the direction different from FIG. 1.

As shown more in detail in FIG. 2, an opening 41 for inserting therein a heat spreader 39 for supporting each power device chip 32 on its upper surface is formed in the control substrate 33. The heat spreader 39 is made of material, such as aluminum nitride, alumina, or the like, which is superior in heat dissipation and insulation, and the lower surface of the heat spreader 39 is attached to the base substrate 34 through a bonding agent 42. The heat spreader 39 is provided at its upper surface with a metal portion 43 treated with DBC. This metal portion 43 is disposed so that its lower, copper portion is made to contact with the heat spreader 39 and its upper, nickel-plated portion is fixed to a collector terminal 44 of the power device chip 32 through solder 45. Each power device chip 32 has a base electrode 46 and an emitter electrode (not-shown) on its upper surface, and the lower surface as a whole acts as the collector terminal 44. Through wire bonding with aluminum wire 48, the solder 45 is connected to a pattern 47 on the control substrate 33 so that collector terminal 44 is connected to the pattern 47 through the solder 45 and the aluminum wire 48. Through wire bonding with other aluminum wire 48, the base electrode 46 is connected to a pattern 49 on the control substrate 33. The upper surfaces of the patterns 47 and 49 are plated with nickel and the nickel plating is further flash-plated with gold to make the bonding with the aluminum wire 49 sure and firm. Each power device chip 32 is covered with a sealing material 50 composed of epoxy resin, silica powder as a filler, a coloring agent such as carbon black as an additive, a fire retarding material such as an oxalic acid, etc., in order to protect the power device chip physically, chemically and electrically.

Thus, in the power module 31 in this first embodiment, the opening 41 for insertion of the heat spreader 39 is formed in the control substrate 33 so that the heat spreader 39 is inserted into the opening 41 so as to be mounted on the base substrate 34. Accordingly, the power module 31 has a substantially single layer structure so that it is possible to reduce its height to half in comparison with a conventional two-layer system. Further, since the side edge of the heat spreader 39 is disposed at a distance from the side surface of the opening 41, the heat of the power device chip 32 on the heat spreader 39 is not directly transmitted to the control substrate 33 through the heat spreader 39, and since the lower surface of the heat spreader 39 is fixed on the base substrate 34, the heat transmitted to the heat spreader 39 is further transmitted from the heat spreader 39 to the base substrate 34 and dissipated from the base substrate 34. Accordingly, the heat is less transmitted from the heat spreader 39 to the circuit elements on the control substrate 33, so that it is possible to dispose these circuit elements close to the power device chip 32, and it is therefore possible to reduce the area of the control substrate 33. Accordingly, it is possible to reduce the power module 31 in size in comparison with conventional ones. Further, since the power device chip 32 and the control substrate 33 are connected to each other through the aluminum wire 48, it is possible to absorb the difference in the thermal expansion coefficients between the heat spreader 39 and the control substrate 33 to thereby make it possible to improve the reliability against thermal stress.

The assembling work of this power module 31 will be described. First, the power device chip 32 is fixed at its collector terminal 44 side to the metal portion 43 of the heat spreader 39 through the solder 45. Next, the circuit elements 36 of the circuits for driving and controlling the chip are mounted on the control substrate 33, and the control substrate 33 is fixed to the base substrate 34 through the bonding agent 42. The heat spreader 39 is applied with the bonding agent 42, inserted to the opening 41, and fixed to the base substrate 34. The wire bonding with the aluminum wire 48 is performed between the base electrode 46 of the power device chip 32 and the pattern 49 of the control substrate 33 and between the solder 45 and the pattern 47, and the wire bonding with the aluminum wire (not shown) is also performed between a not-shown emitter electrode and a pattern of the control substrate 33 (not shown) to which the emitter terminal 44 is to be connected, to thereby complete the electric connection. The case cover 35 is then attached.

Figure 3:
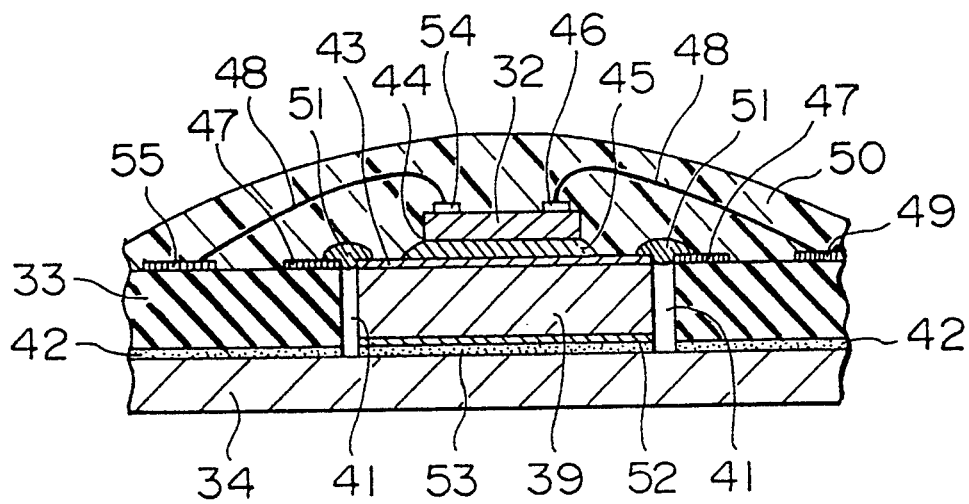
FIG. 3 is an enlarged vertical sectional view illustrating a module according to the present invention; power device chip portion in a second embodiment of the power
Figure 4:
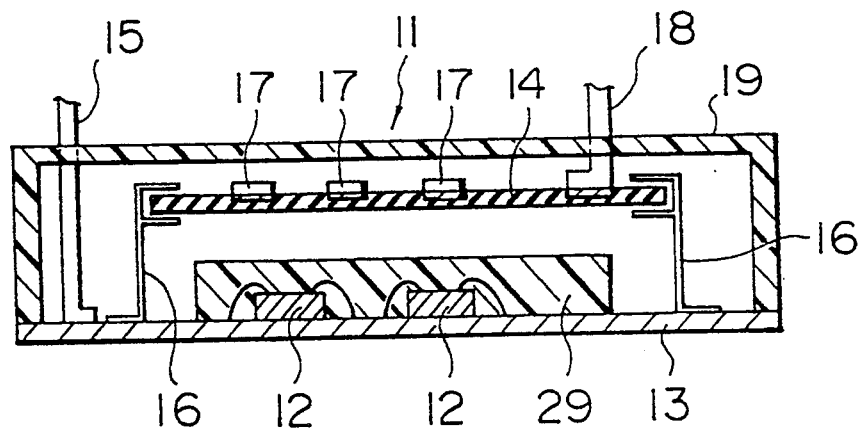
FIG. 4 is a vertical sectional view illustrating a main portion of an example of the conventional power module.
Figure 5:
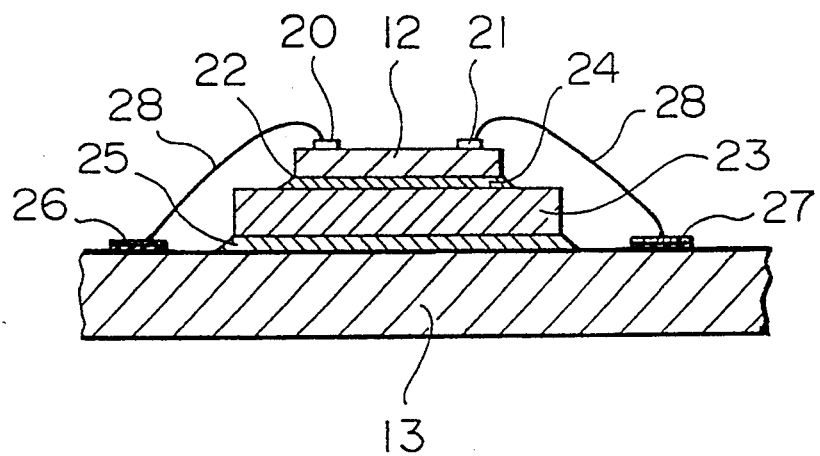
FIG. 5 is an enlarged vertical sectional view illustrating a power device chip portion in the example of FIG. 4.

In a second embodiment shown in FIG. 3, a pattern 47 for connection to a collector terminal 44 of each power device chip 32 is provided near an opening 41 of a control substrate 33, and this pattern 47 and a metal portion 43 are connected to each other through solder 51. A heat spreader 39 and the control substrate 33 are fixed to each other firmly through soldering, so that the heat spreader 39 and the control substrate 33 are held surely even if there occurs contraction due to the difference in thermal expansion coefficient between the heat spreader 39 and the control substrate 33. It is therefore possible to improve the reliability against thermal stress. Further, in this second embodiment, a metal portion 52 similar to the metal portion 43 is provided on the lower surface of the heat spreader 39, and fixed to the base substrate 34 through solder 53. Consequently, it is possible to improve the stability of the heat spreader 39 to the base substrate 34. The reference numeral 54 represents an emitter electrode of the power device chip 32, the emitter electrode 54 is being connected through aluminum wire 48 to a pattern 55 of the control substrate 33 to which the emitter terminal 54 is to be connected.

Although the present invention has been described with reference to its preferred embodiments, the description is to make the invention understood, and the invention can be modified variously without departing from the appended claims.

What is claimed is:

1. A power module having at least one power device chip and circuit elements for driving and controlling said chip, said power module comprising:
   a base substrate formed of a metal plate having a heat dissipation property,
   a control substrate fixed on the base substrate by a bonding agent, said control substrate having at least one opening, printed patterns formed on an upper surface thereof, and a printed connection pattern formed on the upper surface of the control substrate and connected to the printed patterns, said circuit elements being fixed to the control substrate and connected to the printed patterns,
   a heat spreader situated in the opening of the control substrate and fixed to the base substrate by a bonding agent, said heat spreader having a thickness substantially the same as that of the control substrate and formed of a material having a heat dissipation property, said power device chip being fixed on the heat spreader by soldering,
   wire bonding connected between said power device chip and said printed connection pattern,
   a sealing compound covering an upper surface of the power device chip, a part of the control substrate and the wire bonding, said sealing compound being formed of a resin, silica powder and an additive,
   control and output terminals fixed to the control substrate and connected to the printed patterns, and
   a case cover fixed to the base substrate for substantially covering the control substrate, the heat spreader with the power device chip and the circuit elements, said case cover being spaced for a predetermined distance away from an upper surface of the control substrate, said control and output terminals fixed on the control substrate extending and passing through the case cover.

2. A power module according to claim 1, wherein said power device chip includes base and emitter electrodes on the upper surface thereof and a collector terminal at a lower surface of the chip, and said heat spreader includes, at an upper surface, an upper metal portion having a heat conductivity and an electric conductivity, said lower surface of the power device chip being connected to the upper metal portion of the heat spreader by the soldering and connected to the printed connection pattern.

3. A power module according to claim 2, wherein said heat spreader includes, at a lower surface, a lower metal portion having a heat conductivity and an electric conductivity, said lower metal portion being connected to the base substrate by soldering, said upper metal portion of the heat spreader being connected to the printed connection pattern by soldering.

4. A power module according to claim 1, in which an upper surface of said printed connection pattern is plated with nickel and the nickel plating is further flash plated with gold, and aluminum wire is used for said wire bonding.

5. A power module according to claim 1, in which said upper metal portion is constituted by DBC in which nickel plating is given to an upper surface of copper, and said nickel plating is connected to the lower surface of said power device chip through soldering.

6. A power module according to claim 1, in which said lower metal portion is constituted by DBC in which nickel plating is given to an upper surface of copper, and said nickel plating is connected to said base substrate through soldering.

* * * * *